United States Patent
Finn

(10) Patent No.: US 8,240,022 B2
(45) Date of Patent: *Aug. 14, 2012

(54) METHODS OF CONNECTING AN ANTENNA TO A TRANSPONDER CHIP

(75) Inventor: David Finn, Tourmakeady (IE)

(73) Assignee: Feinics Amatech Teorowita, Toumakeady, Comayo (IE)

( * ) Notice: Subject to any disclaimer, the term of this patent is extended or adjusted under 35 U.S.C. 154(b) by 153 days.

This patent is subject to a terminal disclaimer.

(21) Appl. No.: 11/831,987

(22) Filed: Aug. 1, 2007

(65) Prior Publication Data

US 2008/0073800 A1   Mar. 27, 2008

Related U.S. Application Data

(63) Continuation-in-part of application No. 11/760,793, filed on Jun. 11, 2007, now abandoned, which is a continuation-in-part of application No. 11/773,434, filed on Jul. 5, 2007, now Pat. No. 7,581,308.

(60) Provisional application No. 60/884,158, filed on Jan. 9, 2007, provisional application No. 60/887,294, filed on Jan. 30, 2007, provisional application No. 60/894,469, filed on Mar. 13, 2007, provisional application No. 60/938,454, filed on May 17, 2007.

(51) Int. Cl.
*H01R 4/00* (2006.01)

(52) U.S. Cl. ............ 29/592.1; 29/600; 29/825; 29/831; 343/700 MS; 235/492

(58) Field of Classification Search .................... 29/600, 29/601, 592.1–594, 830, 846, 832; 343/786, 343/872, 700 MS; 235/492, 441, 487, 380–383; 340/572.7
See application file for complete search history.

(56) References Cited

U.S. PATENT DOCUMENTS

| | | | |
|---|---|---|---|
| 3,674,914 A | 7/1972 | Burr | |
| 4,014,602 A | 3/1977 | Ruell | |
| 4,437,603 A | 3/1984 | Kobayashi et al. | |
| 4,533,787 A | 8/1985 | Anderegg et al. | |
| 4,641,773 A | 2/1987 | Morino et al. | |
| 4,693,778 A | 9/1987 | Swiggett et al. | |
| 4,730,188 A | 3/1988 | Milheiser | |
| 4,884,334 A | 12/1989 | Houser et al. | |
| 4,897,644 A | 1/1990 | Hirano | |

(Continued)

FOREIGN PATENT DOCUMENTS

CA         2279176         7/1998

(Continued)

*Primary Examiner* — Minh Trinh
(74) *Attorney, Agent, or Firm* — Gerald E Linden

(57) ABSTRACT

Method of connecting an antenna wire to a transponder chip. A transponder chip or chip module in a recess in a substrate, and an antenna wire mounted to the surface of the substrate and having end portions spanning the recess. The end portions are spaced wider than the chip, to allow the chip to be inserted (installed) into the recess from the same side as the antenna past the end portions of the antenna wire. The chip may be moved in the recess so that its terminals are under the wires, or the wires may be repositioned to be over the terminals, for subsequently bonding thereto. Prior to installing the chip in the recess, insulation may be removed from the end portions of the antenna wire, which may also be flattened to improve bonding.

19 Claims, 6 Drawing Sheets

U.S. PATENT DOCUMENTS

| | | | |
|---|---|---|---|
| 4,912,143 A | 3/1990 | Ahn et al. | |
| 5,034,648 A | 7/1991 | Gastgeb | |
| 5,041,826 A | 8/1991 | Milheiser | |
| 5,083,087 A | 1/1992 | Fox et al. | |
| 5,084,699 A | 1/1992 | DeMichele | |
| 5,094,907 A | 3/1992 | Yamamura et al. | |
| 5,166,676 A | 11/1992 | Milheiser | |
| 5,201,453 A | 4/1993 | Amador et al. | |
| 5,211,129 A | 5/1993 | Taylor et al. | |
| 5,281,855 A | 1/1994 | Hadden et al. | |
| 5,340,946 A | 8/1994 | Friedrich et al. | |
| 5,365,657 A | 11/1994 | Brown et al. | |
| 5,376,778 A | 12/1994 | Kreft | |
| 5,399,847 A | 3/1995 | Droz | |
| 5,491,302 A | 2/1996 | Distefano et al. | |
| 5,566,441 A * | 10/1996 | Marsh et al. | 29/600 |
| 5,696,363 A | 12/1997 | Larchevesque | |
| 5,741,392 A | 4/1998 | Droz | |
| 5,773,812 A | 6/1998 | Kreft | |
| 5,809,633 A | 9/1998 | Mundigl et al. | |
| 6,008,993 A | 12/1999 | Kreft | |
| 6,088,230 A | 7/2000 | Finn et al. | |
| 6,095,423 A | 8/2000 | Houdeau et al. | |
| 6,095,915 A | 8/2000 | Geissler et al. | |
| 6,107,920 A | 8/2000 | Eberhardt et al. | |
| 6,111,288 A | 8/2000 | Watanabe et al. | |
| 6,140,707 A | 10/2000 | Plepys et al. | |
| 6,142,381 A | 11/2000 | Finn et al. | |
| 6,190,942 B1 | 2/2001 | Wilm et al. | |
| 6,206,292 B1 | 3/2001 | Robertz et al. | |
| 6,233,818 B1 | 5/2001 | Finn et al. | |
| 6,259,369 B1 | 7/2001 | Monico | |
| 6,288,443 B1 | 9/2001 | Finn et al. | |
| 6,310,778 B1 | 10/2001 | Finn et al. | |
| 6,343,744 B1 | 2/2002 | Shibata et al. | |
| 6,424,029 B1 | 7/2002 | Giesler | |
| 6,471,878 B1 | 10/2002 | Greene et al. | |
| 6,521,829 B2 | 2/2003 | Matsumura et al. | |
| 6,522,308 B1 | 2/2003 | Mathieu | |
| 6,575,374 B1 | 6/2003 | Boyadjian et al. | |
| 6,606,247 B2 | 8/2003 | Credelle et al. | |
| 6,626,364 B2 | 9/2003 | Taban | |
| 6,628,240 B2 | 9/2003 | Amadeo | |
| 6,667,092 B1 | 12/2003 | Brollier et al. | |
| 6,677,917 B2 | 1/2004 | Van Heerden et al. | |
| 6,698,089 B2 | 3/2004 | Finn et al. | |
| 6,870,497 B2 | 3/2005 | Kondo et al. | |
| 6,879,424 B2 | 4/2005 | Vincent et al. | |
| 6,956,182 B2 | 10/2005 | Gregory | |
| 7,011,980 B1 | 3/2006 | Na et al. | |
| 7,054,050 B2 | 5/2006 | Vincent et al. | |
| 7,093,499 B2 | 8/2006 | Baudendistel | |
| 7,145,432 B2 | 12/2006 | Lussey et al. | |
| 7,176,053 B1 | 2/2007 | Dimmler | |
| 7,546,671 B2 * | 6/2009 | Finn | 29/592.1 |
| 7,581,308 B2 * | 9/2009 | Finn | 29/600 |
| 7,979,975 B2 * | 7/2011 | Finn | 29/592.1 |
| 2002/0020903 A1 | 2/2002 | Kreft et al. | |
| 2003/0132301 A1 | 7/2003 | Selker | |
| 2004/0089707 A1 | 5/2004 | Cortina et al. | |
| 2004/0155114 A1 | 8/2004 | Rietzler | |
| 2005/0206524 A1 | 9/2005 | Forster et al. | |
| 2005/0282355 A1 | 12/2005 | Edwards et al. | |
| 2005/0282495 A1 | 12/2005 | Forster | |
| 2006/0114109 A1 | 6/2006 | Geissler | |
| 2006/0255903 A1 | 11/2006 | Lussey et al. | |
| 2007/0130754 A1 | 6/2007 | Fein | |
| 2007/0290051 A1 | 12/2007 | Bielmann et al. | |

FOREIGN PATENT DOCUMENTS

| | | |
|---|---|---|
| CA | 2555034 | 9/2005 |
| DE | 19542900 | 5/1997 |
| DE | 196 46 717 | 5/1998 |
| DE | 19742126 | 3/1999 |
| DE | 10140662 | 3/2003 |
| DE | 10 2004 045 896 | 3/2006 |
| DE | 20 2007 013680 | 1/2008 |
| FR | 2728710 | 6/1996 |
| WO | WO98/20450 | 5/1998 |
| WO | WO 00/21030 | 4/2000 |
| WO | WO 00/36891 | 6/2000 |

* cited by examiner

METHODS OF CONNECTING AN ANTENNA TO A TRANSPONDER CHIP

FIELD OF THE INVENTION

The invention relates to techniques for interconnection of lead wires to an integrated circuit (IC), such as in the context of an inlay having a wire which is an antenna wire mounted such as by embedding the wire to the surface of a substrate, followed by bonding end portions of the antenna wire to terminals (bond pads) of a transponder IC disposed in a recess in the substrate.

BACKGROUND OF THE INVENTION

U.S. Pat. No. 5,281,855, incorporated by reference in its entirety herein, discloses a method and apparatus for facilitating interconnection of lead wires to an integrated circuit including the provision of an additional protective layer of insulation to the top of an integrated circuit chip or die and the provision of enlarged plated electrodes to the surface of the additional insulation to form enhanced bonding pads, such pads being electrically connected through the protective layers to the normal bonding pads of the integrated circuit device. The enhanced bonding pads are made of a soft conductive metal such that external wires to be attached thereto can be bonded to the pads using a thermal compression bonding technique.

U.S. Pat. No. 6,088,230, incorporated by reference in its entirety herein, discloses a procedure for producing a transponder unit (55) provided with at least one chip (16) and one coil (18), and in particular a chip card/chip-mounting board (17) wherein the chip and the coil are mounted on one common substrate (15) and the coil is formed by installing a coil wire (21) and connecting the coil-wire ends (19, 23) to the contact surfaces (20, 24) of the chip on the substrate.

U.S. Pat. No. 6,698,089, incorporated by reference in its entirety herein, discloses a device for the contacting of a wire conductor (113) in the course of the manufacture of a transponder unit arranged on a substrate (111) and comprising a wire coil (112) and a chip unit (115), wherein in a first phase the wire conductor (113) is guided away via the terminal area (118, 119) or a region accepting the terminal area and is fixed on the substrate (111) relative to the terminal area (118, 119) or the region assigned to the terminal area by a wire guide and a portal, and in a second phase the connection of the wire conductor (113) to the terminal area (118,119) is effected by means of a connecting instrument (125). See also U.S. Pat. No. 6,233,818, incorporated by reference in its entirety herein.

Canada Patent Application CA 2555034 discloses a method for the production of a book-type security document with at least one security cambric (15) and at least one transponder unit (21), characterized in that: at least one laminated layer (22, 23) is applied at least on one side of the at least one security cambric (4 5) and on at least one side of the at least one transponder unit (21); the at least one security cambric (15) and the at least one transponder unit (21) are fully encompassed by the laminated layers (22, 23) and that a circumferential, closed edge (24) is provided by the laminated layers (22, 231, and that a laminated layer sheath (25) is formed.

U.S. Pat. No. 7,229,022 discloses method for producing a contactless chip card and chip card. A method for producing a transponder, especially a contactless chip card (1) comprises at least one electronic component (chip module 2) and at least one antenna (3); the at least one electronic chip component (2) being disposed on a non-conducting substrate that serves as a support for the component. The at least one antenna is also disposed on a non-conducting substrate, the at least one electronic component (2) being applied to a first substrate and the antenna (3) on a second substrate. The entire circuit (1) is then produced by joining the individual substrates so that they are correctly positioned relative to each other. The components (2, 3) are contacted once the different substrates have been joined by means of auxiliary materials such as solder or glue, or without auxiliary materials by microwelding. The non-conducting substrates form a base card body.

Definitions

As used herein, an "inlay" is a generally planar substrate (or sheet), which may include several (a plurality of) distinct "transponder areas" (or "transponder sites"), arranged for example in a 3×6 array on the planar substrate. The inlay sheet may have one or more (multiple) layers, including one or more "top layers" and one or more "bottom layers". A "transponder" may be fabricated in each "transponder area". Each "transponder" may include an antenna, which is mounted to a surface (such as a top layer) of the substrate, and a "transponder chip" which is installed at a "transponder chip site" (or "site for the transponder chip") on the substrate. The antenna is typically in the form of a flat coil having two ends, which are connected to bond pads (terminals) on the "transponder chip". The "transponder chip" may be an individual integrated circuit (IC) chip, or a chip module (such as a chip mounted to a small substrate or a carrier). The "transponder chip site" of the "transponder" ("transponder area" of the "inlay sheet") may comprise a recess (or window, or opening) extending through the top and one or more underlying layers of the substrate, such that the "transponder chip" can be installed in the recess, submerged below (or even with) the top surface of the planar substrate and supported by an underlying layer of the planar substrate. A window may extend completely through the planar substrate so that a transponder chip or chip module may be installed from an opposite (from the antenna) side of the planar substrate.

As used herein, the word "chip" can encompass many configurations of a silicon die or a packaged chip. The silicon die for example can have metalized bumps to facilitate the direct connection of the wire ends of an antenna to form a transponder or tag device. A packaged chip can include various structures such as a tape automated bonding module, a chip module, a flip chip module, a lead frame, a chip carrier, a strap, an interposer or any form of packaging to facilitate transponder manufacturing.

Regarding metalized bumps on chips, normally chips (also referred to as "dice", plural of "die") have aluminum pads 100×100 microns in dimension. Gold bumps may be sputtered or plated onto the aluminum pads and rise 25 microns above the pads. Enhanced pads or so-called "mega bumps" can be large and can be mounted over the active structure of a die.

An inlay substrate typically has a plurality, such as an array of transponder sites on a substrate which matches the position of the data or graphics on a printed sheet or holder/cover page of a smart card or electronic passport respectively. An "inlay" is generally a semi-finished product that requires additional layers of material (e.g., printed sheet) to complete a "final product" (e.g., electronic passport or smart card).

An inlay with an array of transponder sites may be produced by placing sheets of synthetic material or coated paper on top of each other with an antenna or antennae and electronic components at each site sandwiched between layers of sheet material. To integrate the electronic components such as an RFID chip module, a cavity at each site is punched into one or more of the top layers, in order to protect the chip modules during hot lamination.

"RFID" is short for "Radio Frequency Identification". An RFID device interacts, typically at a limited distance, with a "reader", and may be either "passive" (powered by the reader) or "active" (having its own power source, such as a battery). As used herein, a transponder may comprise an RFID chip (either passive or active) connected to an antenna. (A "transponder chip" may be an "RFID chip".)

An Inlay and Transponder of the Prior Art

FIGS. 1A and 1B illustrate an inlay substrate (or sheet) 100 having a plurality of transponder areas. A selected one of the transponder areas 102 constituting a single transponder is shown in detail. The vertical and horizontal dashed lines (in FIG. 1A) are intended to indicate that there may be additional transponder areas (and corresponding additional transponders) disposed to the left and right of, as well as above and below, the transponder area 102, on the inlay sheet 100. Such a plurality of transponders may be arranged in an array on the (larger) inlay sheet. As best viewed in FIG. 1B, the inlay sheet 100 may be a multi-layer substrate 104 comprising one or more upper (top) layers 104a and one or more lower (bottom) layers 104b.

A recess 106 may be formed in the upper layer 104a, at a "transponder chip site", so that a transponder chip 108 may be disposed in the recess, and supported by the lower layer 104b. The transponder chip 108 is shown having two terminals 108a and 108b on a top surface thereof.

Generally, the recess 106 is sized and shaped to accurately position the transponder chip 108, having side dimensions only slightly larger than the transponder chip 108 to allow the transponder chip 108 to be located within the recess. For example, the transponder chip 108 may measure: 5.0×8.0 mm
the recess 106 may measure: 5.1×8.1 mm
the terminals 108a/b may measure: 5.0×1.45 mm
the wire (discussed below) may have a diameter between 60 and 112 µm One millimeter (mm) equals one thousand (1000) micrometers (µm, "micron").

In FIGS. 1A and 1B, the recess 106 may be illustrated with an exaggerated gap between its inside edges and the outside edges of the chip 108, for illustrative clarity. In reality, the gap may be only approximately 50 µm-100 µm (0.05 mm-0.1 mm).

In FIG. 1A the terminals 108a and 108b are shown reduced in size (narrower in width), for illustrative clarity. (From the dimensions given above, it is apparent that the terminals 108a and 108b can extend substantially the full width of the transponder chip 108.)

It should be understood that the transponder chip 108 is generally snugly received within the recess 106, with dimensions suitable that the chip 108 does not move around after being located within the recess 106, in anticipation of the wire ends 110a, 110b being bonded to the terminals 108a, 108b. As noted from the exemplary dimensions set forth above, only very minor movement of the chip 108, such as a small fraction of a millimeter (such as 50 µm-100 µm) can be tolerated. In relative terms, the gap between the inside edge of the recess 106 (e.g., 0.1 mm) and a side edge of the chip 108 is only approximately up to 2% of a chip dimension. (0.1/5.0=2%; 0.1/8.0=1.25%; 0.05/5.0=1%; 0.05/8.0=0.6%).

As best viewed in FIG. 1A, an antenna wire 110 is disposed on a top surface (side) of the substrate, and may be formed into a flat (generally planar) coil, having two end portions 110a and 110b.

As best viewed in FIG. 1B, the antenna wire is "mounted" to the substrate, which includes "embedding" (countersinking) the antenna wire into the surface of the substrate, or "adhesively placing" (adhesively sticking) the antenna wire on the surface of the substrate. In either case (embedding or adhesively placing), the wire typically feeds out of a capillary 116 of an ultrasonic wire guide tool (not shown). The capillary 116 is typically disposed perpendicular to the surface of the substrate 100. The capillary 116 is omitted from the view in FIG. 1A, for illustrative clarity.

The antenna wire may be considered "heavy" wire (such as 60 µm) and requires higher bonding loads than those used for "fine" wire (such as 30 µm). Rectangular section copper ribbon (such as 60×30 µm) can be used in place of round wire.

The capillary 116 may be vibrated by an ultrasonic vibration mechanism (not shown), so that it vibrates in the vertical or longitudinal (z) direction, such as for embedding the wire in the surface of the substrate, or in a horizontal or transverse (y) direction, such as for adhesively placing the wire on the surface of the substrate. In FIG. 1B, the wire 110 is shown slightly spaced (in drawing terminology, "exploded" away) from the substrate, rather than having been embedded (countersunk) in or adhesively placed (stuck to) on the surface of the substrate.

The antenna wire 110 may be mounted in the form of a flat coil, having two ends portions 110a and 110b. The ends portions 110a and 110b of the antenna coil wire 110 are shown extending over (FIG. 1A) and may subsequently be connected, such as by thermal-compression bonding (not shown), to the terminals 108a and 108b of the transponder chip 108, respectively.

Examples of embedding a wire in a substrate, in the form of a flat coil, and a tool for performing the embedding (and a discussion of bonding), may be found in the aforementioned U.S. Pat. No. 6,698,089 (refer, for example, to FIGS. 1, 2, 4, 5, 12 and 13 of the patent). It is known that a coated, self-bonding wire will stick to a synthetic (e.g., plastic) substrate because when vibrated sufficiently to soften (make sticky) the coating and the substrate.

In FIG. 1B, the wire 110 is shown slightly spaced (in drawing terminology, "exploded" away) from the terminals 108a/b of the transponder chip 108, rather than having been bonded thereto, for illustrative clarity. In practice, this is generally the situation—namely, the end portions of the wires span (or bridge), the recess slightly above the terminals to which they will be bonded, in a subsequent step. Also illustrated in FIG. 1B is a "generic" bond head, poised to move down (see arrow) onto the wire 110b to bond it to the terminal 108b. The bond head 118 is omitted from the view in FIG. 1A, for illustrative clarity.

The interconnection process can be inner lead bonding (diamond tool), thermal compression bonding (thermode), ultrasonic bonding, laser bonding, soldering, ColdHeat soldering (Athalite) or conductive gluing.

As best viewed in FIG. 1A, in case the antenna wire 110 needs to cross over itself, such as is illustrated in the dashed-line circled area "c" of the antenna coil, it is evident that the wire should typically be an insulated wire, generally comprising a metallic core and an insulation (typically a polymer) coating. Generally, it is the polymer coating that facilitates the wire to be "adhesively placed" on (stuck to) a plastic substrate layer. (It is not always the case that the wire needs to cross over itself. See, for example, FIG. 4 of U.S. Pat. No. 6,698, 089).

In order to feed the wire conductor back and forth through the ultrasonic wire guide tool, a wire tension/push mechanism (not shown) can be used or by application of compressed air it is possible to regulate the forward and backward movement of the wire conductor by switching the air flow on and off which produces a condition similar to the Venturi effect.

By way of example, the wire conductor can be self-bonding copper wire or partially coated self bonding copper wire, enamel copper wire or partially coated enamel wire, silver coated copper wire, un-insulated wire, aluminum wire, doped copper wire or litz wire.

By way of example, the substrate can be PVC, PC, PE, PET, PETE, TYVEK, TESLIN, C-FLEX, Paper or Cotton/Noil. The substrate can also have special markings such as luminous threads, water marks, microscopic filings and optical polymer memory for additional security.

FIG. 1A herein resembles FIG. 5 of U.S. Pat. No. 6,698,089 (the '089 patent), which has a similar coil antenna (50) with an initial coil region (51) and a final coil region (52) comparable to the antenna 110 with two end portions 110a and 110b described herein. In the '089 patent, the coil (50) is arranged on a substrate 55 which comprises a substrate recess (56, compare 106 herein) in the interior region (53) of the coil (50).

In FIG. 5 of the '089 patent, it can be seen that the initial and final coil regions (end portions) of the wires extend across the recess. In FIG. 6 of the '089 patent, it can be seen that the recess extends completely through the substrate. If the antenna is mounted to the substrate prior to the chip being installed in the recess (and the antenna is mounted to the front/top surface/side of the substrate, as shown), due to the fact that the antenna wires are "blocking" entry to the recess from the top/front surface of the substrate, the chip must be installed into the recess from the back (bottom) side of the substrate, as indicated by FIG. 6 of the '089 patent.

FIG. 7 of the '089 patent shows the subsequent (inter) connection of the terminal areas 59 of the chip unit 58 to the initial coil region 51 and to the final coil region 52 by means of a thermode 60 which under the influence of pressure and temperature creates a connection by material closure between the wire conductor 20 and the terminal areas 59, as an overall result of which a card module 64 is formed.

Glossary & Definitions

Unless otherwise noted, or as may be evident from the context of their usage, any terms, abbreviations, acronyms or scientific symbols and notations used herein are to be given their ordinary meaning in the technical discipline to which the disclosure most nearly pertains. The following terms, abbreviations and acronyms may be used throughout the descriptions presented herein and should generally be given the following meaning unless contradicted or elaborated upon by other descriptions set forth herein. Some of the terms set forth below may be registered trademarks (®).

Chip As used herein, the word "chip" can encompass many configurations of a silicon die or a packaged chip. The silicon die for example can have metalized bumps to facilitate the direct connection of the wire ends of an antenna to form a transponder. A packaged chip can include various structures such as a tape automated bonding module, a chip module, a flip chip module, a lead frame, a chip carrier, a strap, an interposer or any form of packaging to facilitate transponder manufacturing.

Inlay An inlay substrate typically has a plurality, such as array of transponder sites on a substrate which matches the position of the data or graphics on a printed sheet or holder/cover page of a smart card or electronic passport respectively.

Litz wire Litz Wire is a special type of wire used in electronics. It consists of many thin wires, individually coated with an insulating film and braided, thus increasing the surface area of the conductor and thereby reducing the skin effect and associated power losses when used with high-frequency applications.

PVC short for polyvinyl chloride, (IUPAC Polychloroethene). PVC is a widely used thermoplastic polymer. It can be made softer and more flexible by the addition of plasticizers, the most widely used being phthalates.

PET short for Polyethylene terephthalate (also known as PET, PETE or the obsolete PETP or PET-P). PET is a thermoplastic polymer resin of the polyester family that produced by the chemical industry and is used in synthetic fibers; beverage, food and other liquid containers; thermoforming applications; and engineering resins often in combination with glass fiber. It is one of the most important raw materials used in man-made fibers.

PETE see PET.

Teslin™ Teslin is a synthetic printing media, manufactured by PPG Industries. Teslin is a waterproof synthetic material that works well with an Inkjet printer, Laser printer, or Thermal printer. Teslin is also single-layer, uncoated film, and extremely strong. In fact, the strength of the lamination peel of a Teslin sheet is 2-4 times stronger than other coated synthetic and coated papers. Teslin comes in the sizes of 7 mil to 18 mil, though only sizes 10 mil and 14 mil are sized at 8.5" by 11", for printing with most consumer printers. Also available are perforated versions of Teslin, specifically, 2up, 6up, and 8up.

Tyvek™ Tyvek is a brand of spunbonded olefin, a synthetic material made of high-density polyethylene fibers; the name is a registered trademark of the DuPont Company. The material is very strong; it is difficult to tear but can easily be cut with scissors or any other sharp object. Water vapor can pass through Tyvek, but not liquid water, so the material lends itself to a variety of applications: medical packaging, envelopes, car covers, air and water intrusion barriers (housewrap) under house siding, labels, wristbands, mycology, and graphics.

RFID Short for "Radio Frequency Identification". An RFID device interacts, typically at a limited distance, with a "reader", and may be either "passive" (powered by the reader) or "active" (having its own power source, such as a battery).

Transponder As used herein, a transponder is an RFID chip (either passive or active) connected to an antenna.

BRIEF DESCRIPTION (SUMMARY) OF THE INVENTION

Generally, the invention relates to mounting an antenna wire to a substrate with end portions of the antenna wire bridging a recess in the substrate, and initially spaced farther apart than a width dimension of a chip (or chip module) which can be inserted into the recess, past the spaced-apart "wire bridges".

After installing the chip in the recess, the chip can be moved (repositioned), such that the terminals of the chip are under the wire bridges, for bonding thereto. This can be done by rotating the chip, such as 90 degrees, within the recess. Or the chip can be held stationary and the substrate (with wire bridges spanning the recess) rotated, such as 90 degrees.

Alternatively, after installing the chip in the recess, the wire bridges can then be repositioned so that they are over the terminals of the chip, for bonding thereto.

In either case (moving the chip or repositioning the wire bridges), the relative position of the chip terminals and the wire bridges is changed so that the wire bridges, which are initially positioned away from the chip terminals, are located substantially directly over the chip terminals for bonding thereto.

The antenna wire is typically insulated wire. Prior to disposing the chip in the recess, insulation may be removed from the wire bridges, such as with a laser, to enhance bonding of the wire to the terminals.

The antenna wire is typically round in cross-section. The wire can be flattened, prior to bonding, to enhance bonding of the wire to the terminals.

The substrate may be a multi-layer substrate, and the recess may extend only partially through the substrate so that the chip is supported on lower layer(s) of the substrate. Or, the recess may extend fully through the substrate. Or, the recess may extend only partially through the substrate, and "slot" extensions of the recess extend through the substrate. Slots extending through the substrate are useful for laser insulation removal and flattening the wire.

According to the invention, a method of connecting an antenna wire to a transponder chip comprises: providing a recess in a surface of a substrate; mounting the antenna wire to the surface of the substrate so that two end portions of the antenna wire span the recess; characterized by: the end portions of the antenna wire are spaced a distance apart from one another, wherein the distance is greater than a width dimension of the transponder chip, so that the transponder chip may be disposed in the recess after the antenna wire is mounted to the surface of the substrate. In one embodiment, the chip is moved so that its terminals are under the wires. In another embodiment, the wires are repositioned to be over the terminals of the chip. The two end portions of the antenna wire may subsequently be connected to the corresponding two terminals of the transponder chip. Prior to installing the chip in the recess, insulation may be removed from the end portions of the antenna wire spanning the recess, such as by using a laser, to improve bonding. Prior to installing the chip in the recess, the end portions of the antenna wire spanning the recess may be flattened, such as by using a punch tool, to improve bonding.

BRIEF DESCRIPTION OF THE DRAWINGS

Reference will be made in detail to embodiments of the disclosure, examples of which may be illustrated in the accompanying drawing figures (FIGs). The figures are intended to be illustrative, not limiting. Although the invention is generally described in the context of these embodiments, it should be understood that it is not intended to limit the invention to these particular embodiments.

Certain elements in selected ones of the figures may be illustrated not-to-scale, for illustrative clarity. The cross-sectional views, if any, presented herein may be in the form of "slices", or "near-sighted" cross-sectional views, omitting certain background lines which would otherwise be visible in a true cross-sectional view, for illustrative clarity. In some cases, hidden lines may be drawn as dashed lines (this is conventional), but in other cases they may be drawn as solid lines.

Figure 1A:
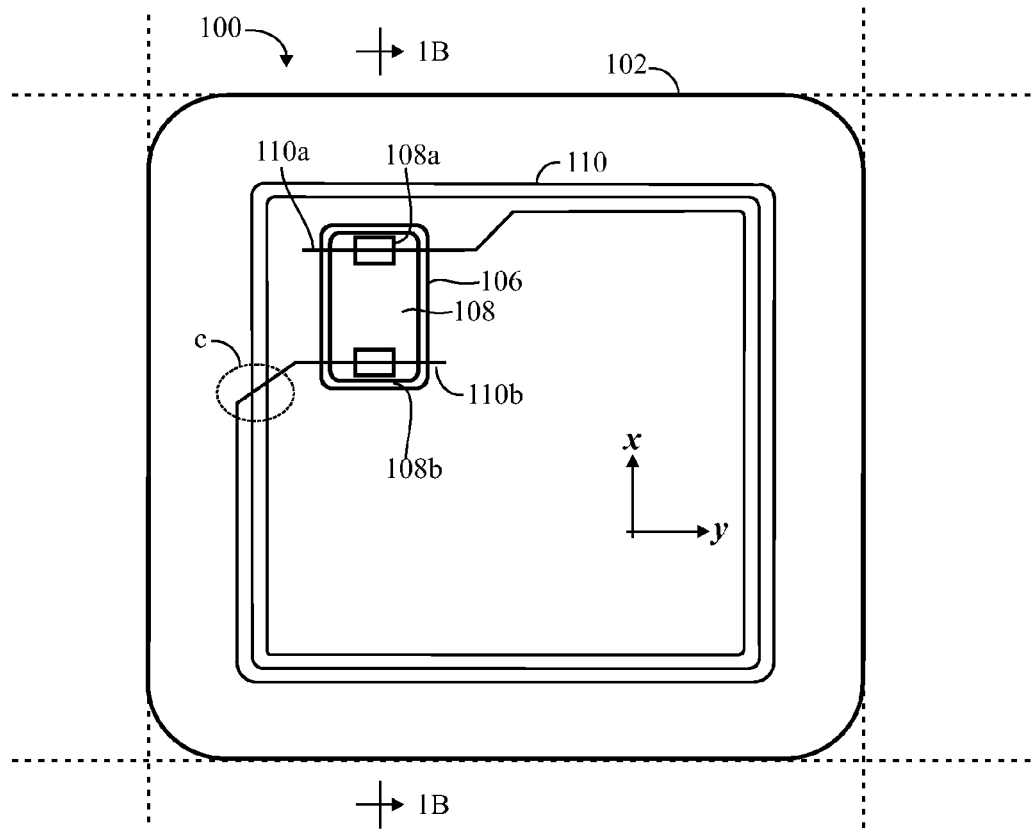

If shading or cross-hatching is used, it is intended to be of use in distinguishing one element from another (such as a cross-hatched element from a neighboring un-shaded element). It should be understood that it is not intended to limit the disclosure due to shading or cross-hatching in the drawing figures.

Elements of the figures may (or may not) be numbered as follows. The most significant digits (hundreds) of the reference number correspond to the figure number. For example, elements of FIG. 1 are typically numbered in the range of 100-199, and elements of FIG. 2 are typically numbered in the range of 200-299. Similar elements throughout the figures may be referred to by similar reference numerals. For example, the element 199 in FIG. 1 may be similar (and possibly identical) to the element 299 in FIG. 2. Throughout the figures, each of a plurality of elements 199 may be referred to individually as 199*a*, 199*b*, 199*c*, etc. Such relationships, if any, between similar elements in the same or different figures will become apparent throughout the specification, including, if applicable, in the claims and abstract.

FIG. 1A is a top view of a transponder site, according to the prior art.

Figure 1B:
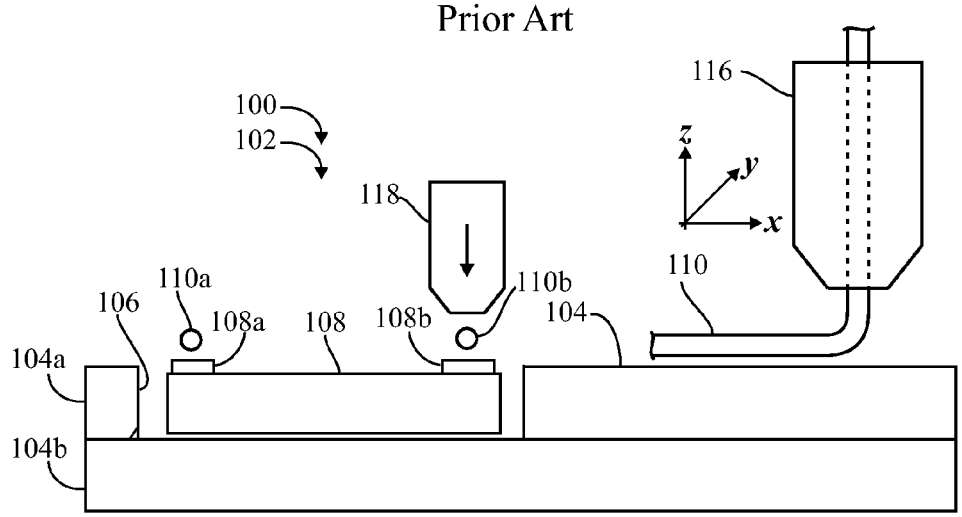

FIG. 1B is a side, cross-sectional view, partially exploded, of a wire being mounted to the substrate of FIG. 1A (and bonded to the terminals of the chip), according to the prior art.

Figure 1C:
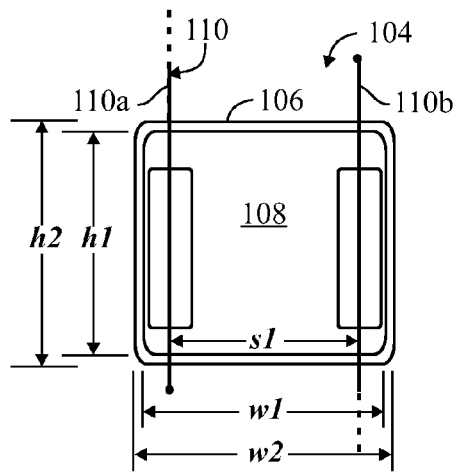

FIG. 1C is a top view of a portion of a transponder site, showing a transponder chip installed in a recess, and end portions of an antenna wire bonded to respective terminals of the transponder chip, according to the prior art.

Figure 2A:
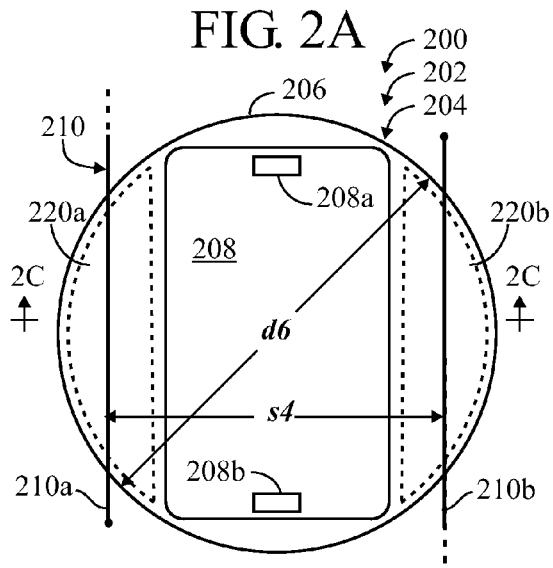

FIG. 2A is a top view of a portion of a transponder site, showing a transponder chip installed in a recess, and end portions of an antenna wire bridging the recess, according to an embodiment of the invention.

Figure 2B:
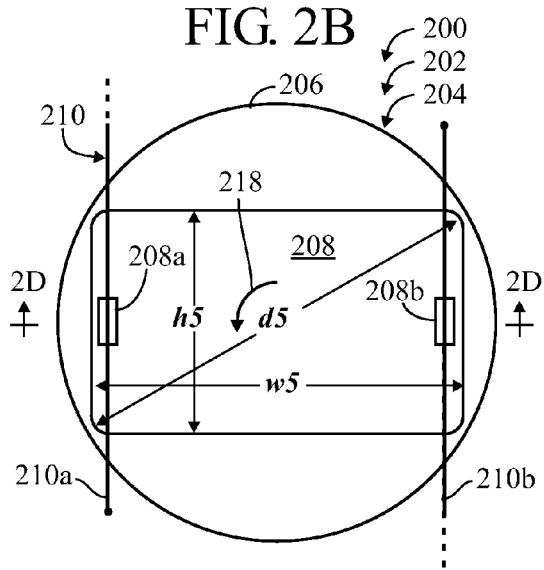

FIG. 2B is a top view of a portion of a transponder site of FIG. 2A, showing the transponder chip repositioned in the recess, so that the end portions of the antenna wire may be bonded to respective terminals of the transponder chip.

Figure 2C:
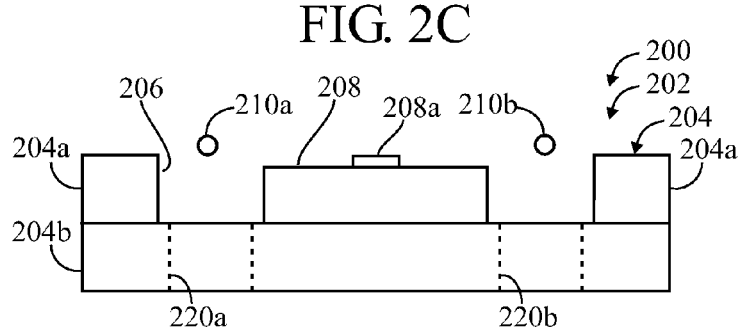

FIG. 2C is a cross-sectional view of the portion of the transponder site shown in FIG. 2A, taken on a line 2C-2C through FIG. 2A.

Figure 2D:
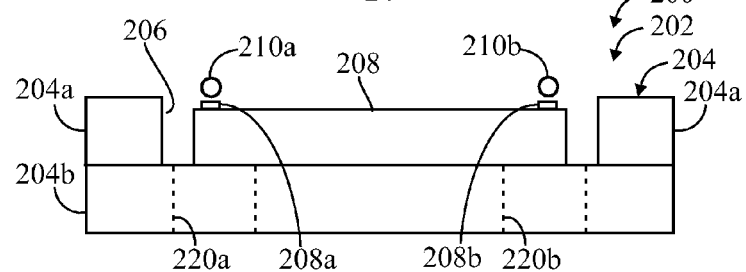

FIG. 2D is a cross-sectional view, partially exploded, of the portion of the transponder site shown in FIG. 2B, taken on a line 2D-2D through FIG. 2B.

Figure 3A:
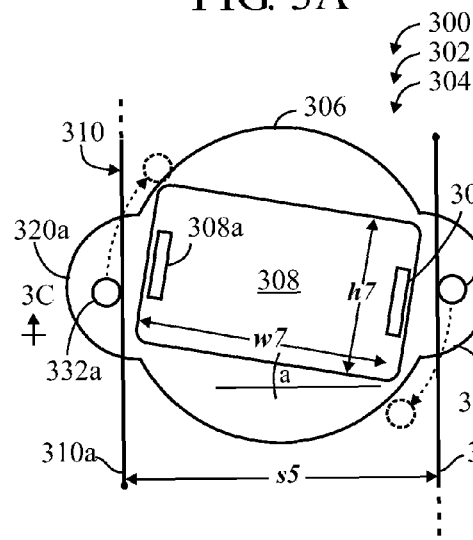

FIG. 3A is a top view of a portion of a transponder site, showing a transponder chip installed in a recess, and end portions of an antenna wire bridging the recess, according to an embodiment of the invention.

Figure 3B:
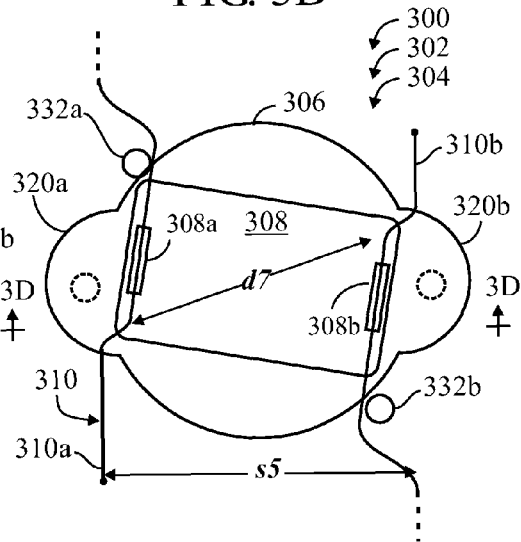

FIG. 3B is a top view of a portion of a transponder site of FIG. 3A, showing the end portions of the antenna having been repositioned, so that the end portions of the antenna wire may be bonded to respective terminals of the transponder chip.

Figure 3C:
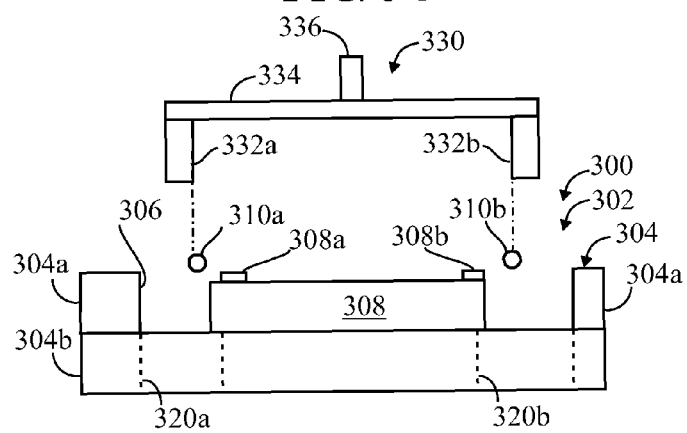

FIG. 3C is a cross-sectional view of the portion of the transponder site shown in FIG. 3A, taken on a line 3C-3C through FIG. 3A.

Figure 3D:
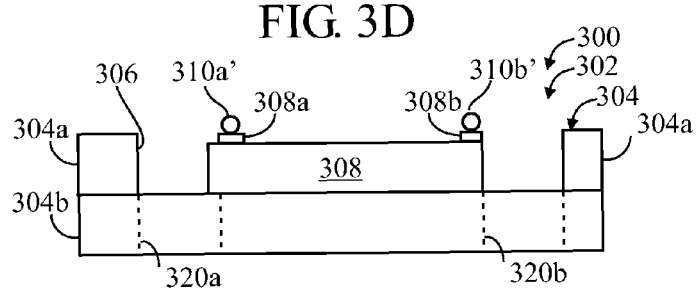

FIG. 3D is a cross-sectional view, partially exploded, of the portion of the transponder site shown in FIG. 3B, taken on a line 3D-3D through FIG. 3B.

Figure 4A:
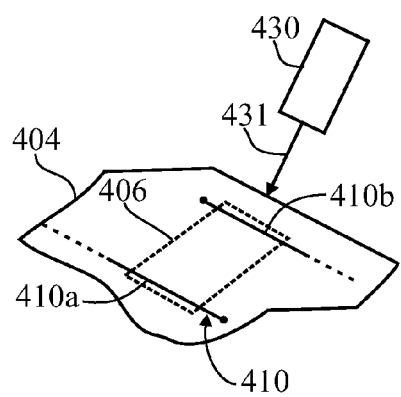

FIG. 4A is a perspective view of a technique for removing insulation from wire bridges, according to an aspect of the invention.

Figure 4B:
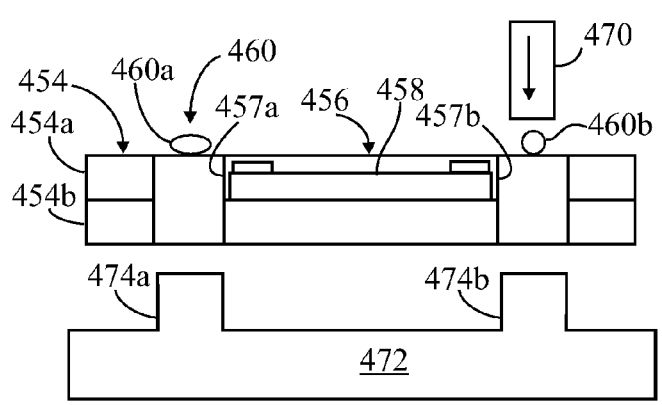

FIG. 4B is a cross-sectional view of an inlay with a chip with wire bridges passing over slots and being flattened, according to an embodiment of the invention.

Figure 5:
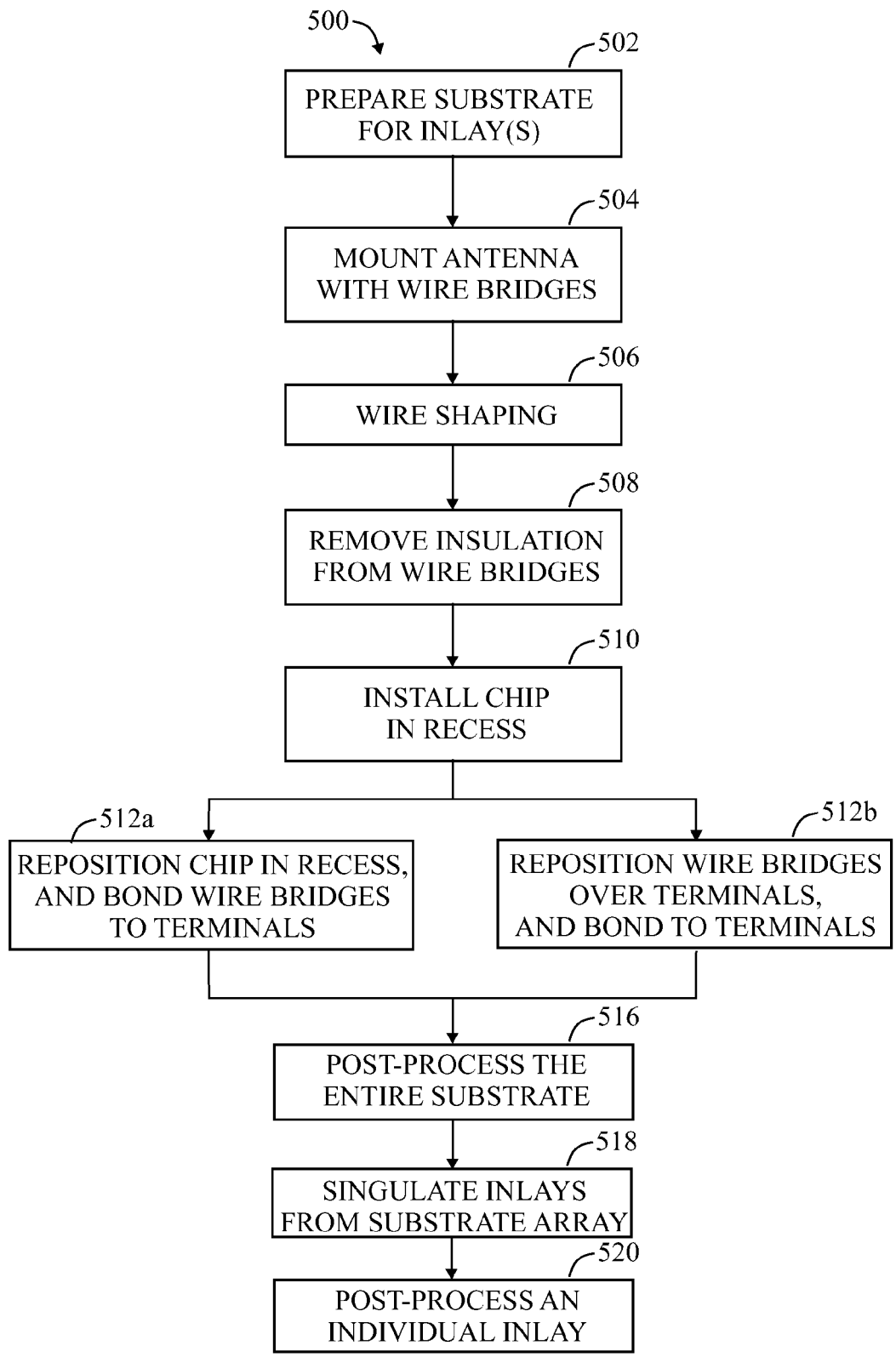

FIG. 5 is a diagram showing a manufacturing flow, according to an embodiment of the invention.

Figure 6A:
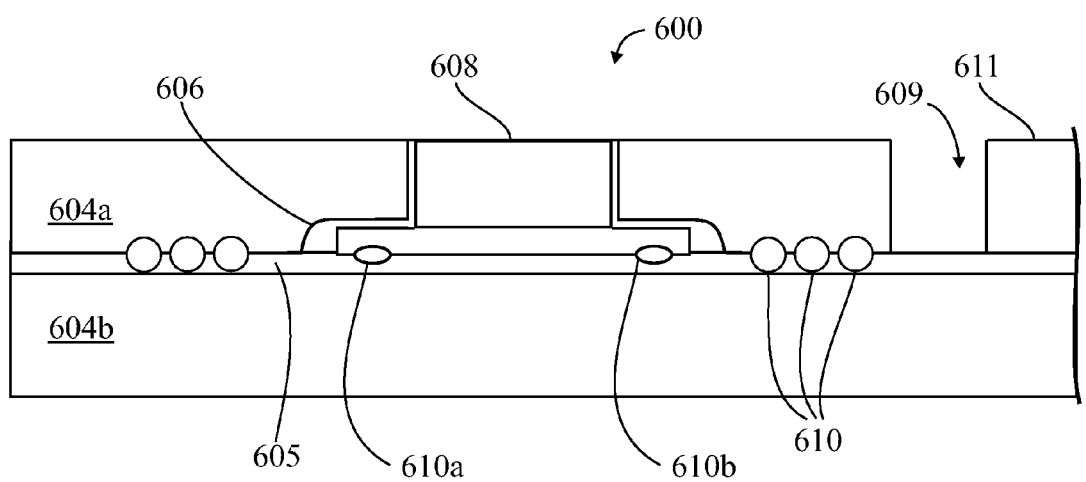

FIG. 6A is a cross-sectional view of an e-passport inlay structure with cover page, according to the prior art.

Figure 6B:
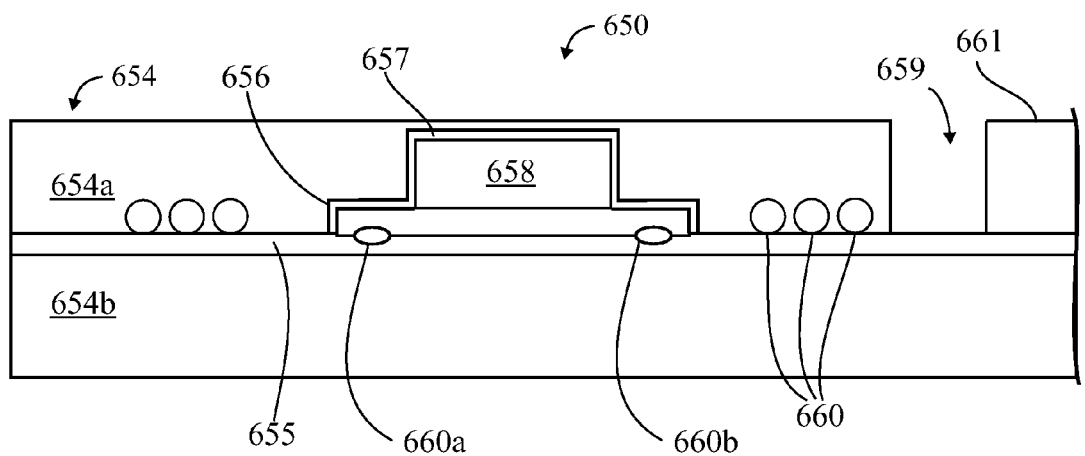

FIG. 6B is a cross-sectional view of an e-passport inlay structure with cover page, according to an embodiment of the invention.

DETAILED DESCRIPTION OF THE INVENTION

Various "embodiments" of the invention will be discussed. An embodiment is an example or implementation of one or more aspects of the invention(s). Although various features of the invention may be described in the context of a single embodiment, the features may also be provided separately or in any suitable combination. Conversely, although the invention may be described herein in the context of separate embodiments for clarity, the invention may also be implemented in a single embodiment.

Some embodiments of the invention may relate to the "mounting" of, or apparatus for the "mounting" of, an antenna wire on inlay substrates (or sheets). As used herein, "mounting" includes embedding the antenna wire in (also called scribing) or adhesively placing the antenna wire on a surface of the substrate. (However, "embedding" should be interpreted to include "adhesively placing", if appropriate in the context of a given embodiment.) Ultimately, ends (or end portions) of the antenna may be connected to "bond pads" or "terminals" of the transponder chip (or chip module), such as by thermal (or thermo) compression bonding.

A conventional exemplary method to produce a transponder containing a high frequency RFID chip and an antenna embedded into a multi-layer substrate and connected to the terminal areas of the RFID chip, is to embed a wire conductor into a top substrate layer in the direction of the RFID chip residing in a recess and supported by a lower substrate layer, then to guide the wire conductor over the first terminal area of the RFID chip, then (after bridging the recess) continue the embedding process by countersinking the wire conductor into the top substrate layer to form an antenna with a specific number of turns, and then guiding the wire conductor over the second terminal area (again, bridging the recess), and finally embedding the wire conductor again into the top substrate layer before cutting the wire to complete the high frequency transponder site. Next, the wire ends passing over the terminals of the RFID chip are interconnected thereto, typically by thermal compression bonding. See, for example, the aforementioned U.S. Pat. No. 6,698,089, as well as FIGS. 1A and 1B described hereinabove.

Mounting an Antenna Wire to a Substrate

Generally, various apparatuses are known for embedding (or adhesively placing) the wire conductor into (or onto) a substrate that can operated either in the transverse axis or in the longitudinal axis.

The oscillation amplitude when operating in the horizontal (x or y) direction can be approximately 5 microns, whereby in the vertical (z) direction 22-25 microns is required to countersink the wire conductor into a substrate.

The operating frequency of the apparatus can be typically 60 KHz, but a frequency of 100 KHz or more can reduce the mechanical mass & dimensions of the ultrasonic wire guide tool and also enhance the performance.

The embedding of self bonding insulated wire into a synthetic substrate is performed using an ultrasonic horn and converter operating at a frequency between 35 and 60 kHz, and exerting a force of approximately 5 N (Newton) to sink the wire into the substrate. To embed onto a paper substrate, more pressure (approximately 15 to 20 N) is required to form an adhesive attachment between the self-bonding insulated wire and the paper substrate. Ultrasonic bonding is performed using a bond tool and transducer operating typically at a frequency of 60 kHz. The process uses a combination of vibration and force to effectively scrub the interface between the wire and the terminal area of the chip, causing a localized temperature rise, promoting the diffusion of molecules across the boundary.

It is generally sufficient, for purposes of this patent application, to take note of the fact that tools are known for mounting wires (such as a 60 micron wire) to a substrate, in a pattern (such as the antenna coil shown in FIG. 1B, and these tools can "manipulate" the wire, and where it is embedded, with a high degree of precision (such as a within 10 microns)—for example, the tool shown in U.S. Pat. No. 6,698,089.

Insulation Removal

Conventionally, an insulated wire conductor (such as 110) is bonded to the terminal (such as 108a or 108b) of a chip (such as 108) using thermal (or thermo) compression bonding. This is a welding process in which the insulated wire conductor is bonded to the terminal of a chip by passing a current through a thermode, which holds the wire conductor under force against the terminal area of the chip. Typically, the first impulse of current removes the insulation, while the second impulse results in the diffusion of the wire conductor with the terminal area of the chip. To obtain a reasonable deformation of the wire conductor during the bonding process, a force between 1.8 and 2.5 Newton is required. However, the insulation between the wire conductor and the terminal of the chip may not have fully evaporated during the thermal compression bonding process, resulting in an unreliable interconnection.

This quality issue may be resolved by removing the insulation before bonding, by passing the wire conductor through a laser tunnel, before the wire conductor is directed to the ultrasonic wire guide tool. The laser tunnel can be driven by glass fiber connected to a multiplexing diode laser. The inner wall of the tunnel can be coated with a reflective material. The position of the insulation removal can be defined and the length of wire conductor which passes from the laser tunnel to the ultrasonic wire guide tool can be measured. By using an un-insulated wire at the bond position the force required for the diffusion process can be reduced, and better controlled.

A diode laser connected to a glass fiber (400 microns) can be used to remove a section of insulation layer (polyurethane) with a thickness of 2 to 4 microns from a moving wire conductor having a diameter of approximately 112 microns, by directing the laser beam to the side of the wire conductor under a gas atmospheric condition.

Alternatively, rather than removing insulation from the wire prior to mounting (such as with a laser tunnel associated with the wire guide tool), an insulated wire can be mounted to the substrate, and the insulation from end portions of the insulated wire bridging the recess can be removed with a separate laser system. In such a case, it may be convenient, but it is not necessary, that the recess extends all the way through the substrate. In any case, it is believed to be preferable that the insulation (which may be used to help adhere the wire to the substrate, and to prevent short-circuiting at cross-overs such as "c" in FIG. 1A) is removed at portions (segments) of the end portions of the wire which will be bonded to the terminals of the transponder chip. The laser may be an ultraviolet (UV) laser, directing a beam at the wire spanning the recess. If the recess (or slot) extends all the way through the substrate, a mirror may be placed on the opposite side of the substrate to ensure that all of the insulation is removed from the wire.

When using a laser to remove insulation (non-conductive coating, typically enamel) from a wire conductor, in order to facilitate the interconnection of an insulated wire conductor to the terminal areas of an RFID chip, the enamel coating on the wire can be dyed with a dark color (such as black), to enhance absorption of the laser beam, hence heating (and evaporation) of the coating. A bare wire can also be blackened (the enamel is colored black) to increase the absorption of the laser beam, such as when performing interconnection of the wire to a terminal of a chip by laser welding. When using a laser to remove insulation, the wires can be attached to the terminals by conventional thermal compression bonding, or by laser welding, soldering, etc.

Oversize Recesses for the Transponder Chip

A conventional method to produce an inlay is to embed insulated wire into a synthetic material (or a coated substrate), form an antenna coil with a number of turns and interconnect the wire ends of the antenna to a transponder chip (or chip module). The interconnection of the antenna wire to the chip module is non-trivial, and it can be beneficial that the chip module can be installed on a substrate which has already been prepared with an antenna coil.

The chip may be a single integrated circuit (IC) chip, or a chip module including an IC chip. The transponder chip may be a high frequency RFID chip As exemplified by FIG. 1B, typically, before mounting (embedding or adhesively placing) the antenna 110 to the substrate 104, the transponder chip 108 is disposed in the recess 106. Then, the antenna is mounted with its end portions 110a, 110b spanning (bridging) the recess, directly above the terminals 108a, 108b of the transponder chip 108. Then, the end portions 110a, 110b of the antenna wire 110 are bonded to the terminals 108a, 108b of the transponder chip 108.

FIG. 1C shows the chip 108, having two terminals 108a and 108b is disposed in a recess 106 in a substrate (generally designated 104). The chip 108 may be rectangular, having a height dimension "h1" and a width dimension "w1". For example, the chip 108 may measure 5.0 mm by 8.0 mm. The terminals 108a and 108b may be approximately 1.5 mm wide, and may be generally located just within the left and right (as viewed) side edges of the chip 108.

The recess 106 may also be rectangular (having the same shape as the chip), and may be only slightly larger than the chip, such as 0.1 mm greater than the chip in both height "h2" and width "w2". For example, the recess 106 may measure 5.1 mm×8.1 mm. Generally, the recess 106 is large enough to receive the chip 108, and securely locate it, so that the chip 108 does not shift position after being disposed in the recess 106.

End portions 110a and 110b of the antenna wire 110 pass directly over respective terminals 108a and 108b on the chip 108, and are subsequently bonded thereto, as discussed above. The terminals 108a and 108b on the chip are spaced a distance "s1" apart from one another. The wire 110 may have a diameter of approximately 0.1 mm, such as 112 µm.

The end portions 110a and 110b of the antenna wire 110 are disposed on opposite side edges of the recess 106, and are spaced approximately a distance "s1" apart from one another. The distance s1 is less than the chip width dimension w1, to ensure that the end portions 110a and 110b of the antenna wire 110 are positioned over the respective terminals 108a and 108b of the transponder chip 108, for bonding thereto.

The dashed lines extending from the top (as viewed) of the end portion 110a and the bottom (as viewed) of the end portion 110b indicate that the wire 110 continues, forming the antenna coil (see, for example, FIG. 1A). The round dots at the bottom (as viewed) of the end portion 110a and the top (as viewed) of the end portion 110b indicate that the wire ends (stops, does not continue).

A similar situation, wherein the end portions of the antenna wire spanning (or "bridging") the recess, directly above the chip terminals, is shown in FIGS. 4 and 5 of U.S. Pat. No. 6,698,089 ("089 patent"), incorporated by reference in its entirety herein.

A problem with the technique of mounting the end portions of the antenna wire so that they bridge (span across) the recess for the chip is that the if the chip is installed (in the recess) from the front (antenna) side of the substrate it must be installed before the antenna is mounted (consequently, the antenna must be mounted with the chip in place). Else, if it is desired to install the chip after the antenna is mounted, the recess must extend all the way through the substrate (as a "window") and the chip must be installed from the opposite side of the substrate.

It is further discussed in the 089 patent that that a single ultrasonic instrument can be used both for fixation of the wire (mounting the wire on the substrate), and for connection of (bonding) the wire to the terminals of the chip. (column 15, lines 33-36)

The process described above with reference to FIGS. 14 and 15 of the 089 patent also offers the possibility, by appropriate choice of the points of fixation of the wire conductor on the substrate, of guiding the wire conductor away diagonally via the terminal areas, in order to increase the overlap between the wire conductor and the terminal areas. Also, several chips or other elements arranged in series on, or in, a substrate can be connected by means of the wire conductor in the manner represented in FIG. 14. (column 14, lines 39-47)

FIGS. 16 and 17 of the 089 patent show that a chip (132) may be introduced into the recess (114) after fixation of the wire conductor (113) on the surface of the substrate. Ends of the wire pass over the recess, generally in alignment with positions corresponding to terminals on the chip. After the chip is installed (FIG. 16), a connecting instrument enables a connection of the wire conductor to the corresponding terminal area. Also, as discussed in the 089 patent, in order to enable a positioning of the chip that is suitable for contacting of the wire conductor, the chip (132) is equipped on its contact side with a bridge-tape alignment aids (135), arranged adjacent to a terminal area, which provide for correct relative positioning via guide bevels (136).

The transponder illustrated in FIGS. 1A-1C comprises:
  a generally planar substrate which may be a multi-layer substrate, having a recess extending at least partway through the substrate, from a front surface thereof to the back surface thereof,
  an antenna mounted to the front surface of the substrate, and the two end portions of the antenna spanning the recess, as "wire bridges"; and
  a transponder chip (or module) disposed in the recess.

Some limitations of the arrangement illustrated in FIGS. 1A-1C may include:
  (i) if it desired that the antenna be mounted to the substrate before the transponder chip is installed, since the wire bridges are parallel, and are spaced a distance "s1" apart which is less than smaller of the two dimensions "w1" and "h1" of the transponder chip, the recess must extend entirely through the substrate and the transponder chip must be installed from the bottom of the substrate; else
  (ii) if it desired that the recess does not extend all the way through the substrate, due to the wire bridge spacing, the transponder chip must first be disposed in the recess before the antenna wire is mounted to the substrate.

An alternative to the problem set forth in (ii) would be to somehow mount the antenna wire to the front side of the substrate with the end portions of the antenna wire positioned out of the way, then install the transponder chip in the recess from the front side of the substrate, then reposition (manipulate) the end portions of the antenna wire to be over the terminals of the antenna chip, for bonding thereto. However, it is believed that manipulating the wires to be in position over the terminals may have other problems associated therewith, which are sought to be avoided by the present invention.

Repositioning the Chip Relative to the Wire Bridges

FIGS. 2A-2D illustrate an embodiment of the invention, wherein the substrate has a recess or cavity to accommodate a rectangular chip module and the end portions of the antenna wire, which pass over (span, bridge) the cavity. The antenna is mounted to the front (top) side (surface) of the substrate, and the chip can be inserted into a recess extending only partway through the substrate from the front surface thereof, after the antenna is mounted to the front surface of the substrate. Or, the chip can be inserted in to a cavity extending all the way through the substrate, from the opposite back (bottom) side (surface) of the substrate.

In this embodiment, rather than the end portions of the wire passing directly over the terminals of the transponder chip, the end portions of the antenna wire are located adjacent to (next to, rather than directly over) the terminal areas of the chip, and thus form a wire bridge on each side of the chip. The chip module may be positioned in the cavity with the end portions of the antenna wire already stretching over (passing over, spanning, bridging) the cavity (or recess) and mounted to (embedded in or adhesively placed onto) the surface of the substrate.

Generally, as used herein describing embodiments of the invention, the "transponder chip" is an electronic component comprising (having at least) two terminals, which may be a single chip, or a module comprising (having at least) a chip. Generally, the two terminals of the chip or module are interconnected with corresponding two end portions of the antenna wire which is mounted to a top surface of a substrate, which may be a multilayer substrate.

Generally, as used herein describing embodiments of the invention, the transponder chip is disposed in a "recess" or "cavity" which is an opening extending at least partially through the substrate. A "window" is generally an opening that may extend fully through the substrate. A "slot" is another opening (or hole) extending through the substrate next to a recess, cavity or window. In some embodiments, any of recess, cavity, window, or slot (and combinations thereof) may be used, and when the term "recess" is used, it should be understood to include all the variations and combinations, as may be appropriate from the context.

As used herein, a "recess" is generally (and usually) an opening extending only partially through a (typically) multi-layer substrate (the recess may extend completely through top layers only), as may be exemplified by the recess 106 (FIG. 1B). The term "cavity" may be used interchangeably with "recess". A "window" is generally (and usually) an opening extending completely through a substrate (whether or not multilayer), as may be exemplified by the opening 56 in FIG. 6 of U.S. Pat. No. 6,698,089.

An advantage to various embodiments of the invention disclosed herein, particularly those that involve mounting the antenna wire before installing the transponder chip, is that this facilitates removal of insulation (coating) from the antenna wire at the end portions of the wire (wire bridges) where bonding to the terminals of the transponder chip (or chip module) will occur. Various problems which may thus be avoided or minimized may include damaging the chip, unwanted reflections from the chip, accessibility to perform the insulation removal process, inspectability of the insulation removal process, etc.

This embodiment of the invention involves providing an enlarged (oversized) recess (cavity, window) to accept the chip, and creating "wire bridges" spanning the oversized cavity, the wires being spaced sufficiently apart that a chip may be installed between the wire bridges, into the recess. The substrate may be a multi-layer substrate.

Generally, the two wire bridges (end portions of the antenna wire spanning the recess) are spaced farther apart than the width of the chip, so that the chip can be inserted into the recess from the same (top) side of the substrate, past the two wire end portions of the antenna which are bridging (extending across) the recess, after then antenna has been mounted to the substrate.

The recess is sufficiently larger than the chip, so that the chip can be repositioned (moved about) within the recess, such that the terminals of the chip can be re-located to be directly under the wire bridges, for bonding the wire bridges to the terminals. The chip may be moved/repositioned within the recess with a suitable chip manipulating tool, such as a conventional pipette, (not shown).

According to a feature of the invention, after mounting the antenna wire so that the end portions form wire bridges over the recess, insulation may be removed from the wire in preparation for bonding to the terminals of the chip, prior to installing the chip in the recess. Insulation removal may be done with a UV laser, not shown.

According to another feature of the invention, after mounting the antenna wire so that the end portions form wire bridges over the recess, the wire may be flattened to enhance subsequent bonding to the terminals of the chip.

FIGS. 2A-2D illustrate a transponder site 202 (compare 102) on a substrate 204 (compare 104) which may be a portion of an overall inlay sheet 200 (compare 100), whereby an oversized recess 206 (compare 106, which is not an "oversize" recess) is provided for a transponder chip 208 (or chip module, compare 108). The transponder chip 208 may be disposed in the recess 206 after the antenna wire 210 (compare 110) is mounted (embedded in or adhesively place on) the substrate 204.

The chip 208, has two terminals 208a and 208b, and may be rectangular, having a height dimension "h5" and a width dimension "w5". The rectangular chip 208 also has a diagonal dimension "d5". The chip 208 may, for example, be a chip module measuring measure h5=4.0 mm by w5=6.0 mm, and the diagonal dimension d5=7.2 mm. The height dimension h5 is horizontally oriented in FIG. 2A, and is vertically oriented in FIG. 2B. For purposes of this discussion, the height dimension is less than the width dimension (the height dimension is the smaller of the two rectangular dimensions).

The recess 206 is circular having a diameter "d6". The diameter d6 of the recess may be only slightly larger, such as 0.1 mm-0.3 mm greater, than the diagonal dimension d5 of the chip, such as 7.3 mm-7.5 mm.

In FIGS. 2A and 2C, the chip 208 is shown in its initial position in the recess 206, as it may have been installed, between the wire bridges 210a and 210b. Note that the end portions 210a and 210b of the antenna wire 210 do not pass directly over respective terminals 208a and 208b of the chip 208. Rather, the two end portions 210a and 210b of the antenna wire, which may be referred to as "wire bridges", span (bridge, pass over) the recess 206, and are spaced apart from one another a distance (s4) which is greater than the height (h5, smaller of the two rectangular dimensions) of the chip 208, so that the chip 208 can be inserted (installed) into the recess 206 from the same side of the substrate as the antenna, past the end portions of the wires, after the antenna 210 has been mounted (embedded in or adhesively placed on) to the substrate 204. Subsequently, as described in greater detail hereinbelow, the chip 208 is moved (re-positioned, manipulated) so that its terminals 208a and 208b are under respective ones of the end portions 210a and 210b of the antenna wire 210, for bonding thereto.

The dashed lines extending from the top (as viewed) of the end portion 210a and the bottom (as viewed) of the end portion 210b indicate that the antenna wire 210 continues, forming the antenna coil (see FIG. 1A). The dots at the bottom (as viewed) of the end portion 210a and the top (as viewed) of the end portion 210b indicate that the wire ends (stops, does not continue). Depending on antenna configuration, the end portions 210a and 210b could approach the recess from the same side, rather than from opposite sides of the recess.

FIGS. 2A and 2C shows the end portions 210a and 210b of the antenna wire 210 bridging (spanning) the recess 206 near the outer edges thereof. The end portions 210a and 210b of the antenna wire 210 may be spaced (for example) 0.5 mm inward from the respective left and right "side" edges of the cavity 206, in which case the distance s4 between the two wire bridges would be 6.5 mm (7.5 mm-0.5 mm-0.5 mm).

In FIGS. 2A and 2C, the chip module 208 is illustrated inserted into the cavity, with its narrower height dimension disposed in a horizontal orientation.

In FIGS. 2B and 2D, the chip module 208 is illustrated as having been rotated (see arrow 218) 90 degrees within the recess 206, so that its larger width dimension is disposed in a horizontal direction. This brings the terminals 208a and 208b into alignment with, substantially directly below corresponding ones of the end portions 210a and 210b of the antenna wire 210, for bonding thereto. The end portions 210a and 210b of the wire 210 may be bonded to the terminals 208a and 208b using any suitable conventional means for bonding (not shown in this figure, see 118 in FIG. 1B).

As a general proposition, a chip is usually square or rectangular, and a chip module can be virtually any shape, including circular. However, as can be seen in this embodiment, the chip (or module) should be larger in one dimension (such as width) than in another orthogonal dimension (such as height), so that (i) it is narrow enough to be inserted between the wire bridges and (ii) when it is rotated 90 degrees, the terminals are repositioned under the wire bridges for being bonded thereto. The rectangular chip (or chip module) 208 illustrated herein is but one example of various chip (or module) shapes that could be used in conjunction with the techniques disclosed herein.

This movement of the chip imparts a relative motion between the chip 208 and the substrate 204, hence between the chip 208 and the end portions 210a and 210b of the wire 210 mounted to the substrate 204, without actually moving the end portions 210a and 210b of the wire 210.

This movement (218) of the chip imparts a relative motion between the chip and the substrate, hence between the chip and the end portions of the wire mounted to the substrate.

In FIG. 2A it can be observed that the two end portions of the antenna wire are spaced a distance (s4) apart which is greater than at least one of the cross dimensions (h5) of the transponder chip; and in FIG. 2B it can be observed that the distance between the two end portions of the antenna wire is substantially equal to a spacing between the terminals of the transponder chip.

In use, a transponder site commences with the wire conductor being mounted into or onto the substrate over a short distance, then drawing the wire conductor over the recess to form a first wire bridge, continuing mounting the wire conductor into or onto the substrate in forming an antenna, then drawing the wire conductor over the cavity on the opposite side of the recess to create a second wire bridge and finally mounting the wire conductor into or onto the substrate over a short distance before cutting the wire.

Generally, the two wire bridges are substantially parallel with one another, and on opposite sides of the recess. With the circular recess shown herein, the wire bridges form parallel "chords" of the circle, both of which are spaced a significant distance (more than 50% of the radius "r") from the center of the circle. However, it is within the scope of the invention that the two wire bridges span the recess so that they are both on the same side of the recess and/or are not parallel with one another. It is also within the scope of the invention that the recess is other than circular, such as rectangular. It is also within the scope of the invention that the chip (or chip module) is other than rectangular, such as circular. (It is noted semiconductor dies are usually rectangular, including square, as a result of the conventional dicing process.)

The chip 208 may be positioned into the recess 206 from above using a conventional pick & place system (not shown).

A conventional suction pipette (not shown) may be used to rotate the chip (from its position shown in FIG. 2A to its position shown in FIG. 2B). A vision system (not shown) may be needed to ensure accurate positioning during relative movement of the chip.

With the situation described herein, both terminals 208a and 208b are simultaneously brought into position under the corresponding wire bridges 210a and 210b. Then, the wire bridges 210a and 210b are bonded to the corresponding terminals 208a and 208b of the chip.

An advantage of this embodiment is that the wire bridges 210a and 210b need not be disturbed prior to bonding. With 112 µm (diameter) wire, pulling the wire from one position to another is not much of a problem, 60 µm wire is also no much of a problem, but with 30 µm wire, it is generally best to leave the wire alone once it is mounted.

Insulation Removal

The wire bridges 210a and 210b can be first treated with ultraviolet laser to remove the insulation, before bonding the section of un-insulated wire to the terminals 208a and 208b of the chip 208.

In order to facilitate laser treatment, slots 220a and 220b can be provided in the recess 206, under the positions of the wire bridges 210a and 210b. Such slots each forming a diametrically opposed arcuate section of a circle, are illustrated in FIGS. 2A-2D.

As best viewed, for example, in FIG. 2C, the recess 206 extends only partially through the substrate 204, such as through upper layers 204a thereof, so that the chip 208 can be supported by lower layers 204b thereof. The slot portions 220a and 220b of the recess extend further through the substrate 204, continuing through the lower layers 204b of the substrate 204.

It is within the scope of the invention that the slots can have various shapes and sizes. And, there may only be one elongated (such as rectangular) slot that extends entirely across the recess so that one end of the slot is under the one wire bridge 210a and the other end of the slot is under the other wire bridge 210b. It is generally desirable that there is sufficient non-slotted area in the recess that the chip 208 may be well supported on the lower layers 204a of the substrate 204. However, it is within the scope of the invention that the entire recess extends all the way through the substrate 204, in which case the chip 208 would not be supported on the lower layers 204a of the substrate 204.

A mirror can be positioned under a slot so that the laser treatment (insulation removal) process can be direct from above the wire and insulation is removed from the bottom of the wire due to reflection. The process can be performed under atmospheric conditions using inert gas.

Wire Shaping

In addition to facilitating laser removal of insulation from the wire bridges, prior to installing the transponder chip in the recess, slots extending all the way through the substrate provide an opportunity to flatten the otherwise round cross-section wire, before bonding the wire to the terminals of the transponder chip (or chip module). This can be accomplished with the substrate on a workplate (anvil), and impacting the wire from above with a punch. This may be done before installing the transponder chip in the recess, or with the transponder chip in its initial (FIG. 2A) orientation with the slots uncovered.

Thermode Ageing

Regarding thermode ageing, it should be understood that the conventional method to interconnect the wire ends of an antenna to the terminal areas of a chip module is by means of thermal compression bonding. The method makes use of heat by passing pulses of electric current through a thermode and simultaneously applying pressure to cause a diffusion process between the wire and the lead frame of the chip module. The main disadvantages of thermal compression bonding are the ageing of the thermode which requires regular replacement and residues of wire insulation remaining underneath the bonded wire which affects the long term reliability of the interconnection.

This thermode ageing problem can be exacerbated if the chip is not held securely in place, on a rigid work surface. The approach described hereinabove, with respect to FIGS. 2A-2D, provide an opportunity to keep the chip in a fixed position, while causing the aforementioned relative motion between the chip and the wire bridges to bring the terminals of the chip into position for bonding thereto.

Normally (such as may be exemplified by FIGS. 14 and 15 of U.S. Pat. No. 6,698,089), the chip is mounted into the recess first and then the wire is embedded in the substrate. The wires cross over the terminal areas of the chip and thus lie above the terminals. This means that the chip is supported by an underlying substrate. This can cause problems, as follows. Since the chip is supported by the underlying substrate (synthetic material) which is elastic, its surface is not ideal for the bonding process.

For a reliable interconnection and to prevent rapid ageing of the thermode during thermal compression bonding, the surface should be hard like ceramic. Therefore, the current technique of placing the chip in a recess before embedding or placing the chip from below is not conducive for a reliable interconnection in the next stage of the process. The number of bonds which can be achieved using the traditional method is 5,000, whereas with a ceramic plate (heated hot plate), the thermode can withstand 20,000 bonds.

Repositioning the Wire Bridges (FIGS. 3A-3D)

As mentioned above, the wire bridges can be initially positioned, spaced sufficiently apart from one another, that the chip (or chip module) can be inserted in to the recess after the wire bridges are in place. In the FIG. 2 embodiment, the chip is then rotated to position the terminals under the wire bridges for bonding. The possibility of initially disposing the wire bridges wider than the chip, then repositioning the wires (rather than the chip) to align the wire bridges over the chip terminals is now discussed.

FIGS. 3A-3D illustrate a transponder site 302 (compare 102, 202) on a substrate 304 (compare 104, 204) which may be a portion of an overall inlay sheet 300 (compare 100, 200), whereby an oversized recess 306 (compare 106 which is not oversize, and 206 which is oversize) is provided for a transponder chip 308 (or chip module, compare 108, 208). The transponder chip 308 may be disposed in the recess 306 after the antenna wire 310 (compare 110, 210) is mounted (embedded in or adhesively place on) the substrate 304.

The chip 308, has two terminals 308a and 308b, and may be rectangular, having a height dimension "h7" and a width dimension "w7". (The rectangular chip 308 also has a diagonal dimension "d7", not shown.) The chip 308 may, for example, be a chip module measuring measure h7=4.0 mm by w7=6.0 mm (and the diagonal dimension d7=7.2 mm).

The recess 306 is generally circular having a diameter "d8" (diameter not drawn). The diameter "d8" of the recess may be only slightly larger, such as 0.1 mm-0.3 mm greater, than the diagonal dimension "d7" of the chip, such as 7.3 mm-7.5 mm.

The dashed lines extending from the top (as viewed) of the end portion 310a and the bottom (as viewed) of the end portion 310b indicate that the antenna wire 310 continues, forming the antenna coil (see FIG. 1A). The dots at the bottom (as viewed) of the end portion 310a and the top (as viewed) of the end portion 310b indicate that the wire ends (stops, does not continue). Depending on antenna configuration, the end portions 310a and 310b could approach the recess from the same side, rather than from opposite sides of the recess.

The end portions 310a and 310b of the antenna wire 310 which span the recess 306, referred to as "wire bridges", are generally parallel with one another, are spaced a distance "s5" apart from one another, and are disposed on opposite sides of the recess.

The chip 308 is disposed in the recess 306 at a slight angle "a" to horizontal. The angle "a" is suitably approximately 20-30 degrees.

The distance "s5" is slightly greater than the width dimension "w7" of the chip, so that the chip may be inserted (installed) between the wire bridges 310a and 310b, into the recess 306, from the same side of the substrate 304 as the antenna wire 310 is mounted to, but need not be so large as the diagonal dimension "d7" of the chip 308. For a rectangular chip 308 having the exemplary dimensions set forth above (w7=6.0 mm), the distance "s5" may be 6.5-7.0 mm, for example.

In FIGS. 3A and 3C, the chip 308 is shown in its initial position in the recess 306, as it may have been installed, between the wire bridges 310a and 310b. Note that the end portions 310a and 310b of the antenna wire 310 do not pass directly over respective terminals 308a and 308b of the chip 308. Rather, the two end portions 310a and 310b of the antenna wire, which may be referred to as "wire bridges", span (bridge, pass over) the recess 306, and are spaced apart from one another a distance (s5) which is sufficient that the chip (or chip module) 308 may be inserted into the recess 306 from the same side of the substrate 304 as the antenna 310, past the end portions of the wires, after the antenna 310 has been mounted (embedded in or adhesively placed on) to the substrate 304. Subsequently, as described in greater detail hereinbelow, the wire bridges 310a and 310b are re-positioned so as to be substantially directly over respective terminals 308a and 308b of the chip 308, for bonding thereto.

A tool 330 may used to reposition the wire bridges 310a and 310b. The tool 330 is represented somewhat schematically in FIG. 3C. The tool 330 comprises two pins 332a and 332b spaced a distance slightly greater than "s5" apart from one another (best viewed in FIG. 3A), and may be linked to one another by a bar 334, extending from an axle 336. The axle 336 can be mounted to a mechanism (not shown) for rotating (rotationally positioning) the tool 330.

In use, the tool 330 is initially positioned so that the pins 332a and 332b are substantially perpendicular (or "normal") to the surface of the substrate and are located just outside of the wire bridges 310a and 310b, respectively. In FIG. 3A, this initial position of the tool is indicated by the pins 332 and 332b being shown in solid lines. In FIG. 3B, this initial position of the tool is indicated by the pins 332 and 332b being shown in dashed lines.

To reposition the wire bridges 310a and 310b, the tool is rotated, such as 30-60 degrees, which deflects portions of the wire bridges 310a and 310b inward (closer to one another) so that these portions of the wire bridges 310a and 310b are substantially directly over the terminals 308a and 308b of the chip (or chip module) 308, respectively. In FIG. 3B, this rotated position of the tool is indicated by the pins 332 and 332b being shown in solid lines. In FIG. 3A, this rotated position of the tool is indicated by the pins 332 and 332b being shown in dashed lines.

FIG. 3C shows the tool 330 in its initial position, where it can be noted that the wire bridges 310a and 310b are not substantially directly over the terminals 308a and 308b of the chip (or chip module) 308, respectively.

FIG. 3D shows the result of rotating the tool (compare FIG. 3B), with the wire bridges 310a and 310b having been repositioned to be in alignment with, substantially directly above the terminals 308a and 308b of the chip (or chip module) 308, respectively, for bonding thereto. The tool is omitted in this view for illustrative clarity.

Once the wire bridges 310a and 310b have been repositioned to be substantially directly over the terminals 308a and 308b of the chip (or chip module) 308, respectively, the end portions 310a and 310b of the wire 310 may be bonded to the terminals 308a and 308b using any suitable conventional means for bonding (not shown in this figure, see 118 in FIG. 1B). Additionally, the insulation may previously have been removed from the wire bridges and the wire bridges may previously have been flattened to enhance bonding.

In FIG. 3A it can be observed that the two end portions of the antenna wire are initially spaced a distance (s5) apart which is greater than at least one of the cross dimensions (w7) of the transponder chip; and in FIG. 3B it can be observed that the end portions of the antenna wire are repositioned so that the distance between the two end portions of the antenna wire is substantially equal to a spacing between the terminals of the transponder chip, for bonding thereto.

A possible disadvantage of this embodiment (as contrasted with the "rotating the chip" embodiment described hereinabove) is that the wire bridges 310a and 310b need to be manipulated, prior to bonding. With 112 μm (diameter) wire, pulling the wire from one position to another is not much of a problem, 60 μm wire is also no much of a problem, but with 30 μm wire, it is generally best to leave the wire alone once it is mounted.

Tools (FIGS. 4A-4B)

The use of some tools has been mentioned, to implement the methods disclosed herein for mounting an antenna wire on a substrate with end portions of the wire (wire bridges) spanning a recess and spaced sufficiently apart from one another that a transponder chip may be disposed in the recess after the antenna wire is mounted. A suitable tool for mounting the wire to the substrate is shown in U.S. Pat. No. 6,698,089, and need not be discussed further herein. The use of a UV laser for removing insulation from the wire bridges has been discussed.

FIG. 4A illustrates a technique for removing insulation from wire bridges, according to an aspect of the invention. A substrate 404 (compare 204, 304) has a recess 406 (compare 206, 306), which may include slots (207a, 207b). (In this example, the recess 406 is rectangular, for illustrative purposes.) End portions 410a and 410b (compare 210a/b, 310a/b) of an antenna wire 410, which are "wire bridges", span the recess 406 (or slots). Prior to installing a chip (not shown, see 208, 308) into the recess 406, a laser 430 (such as a UV laser) may be used to direct a beam of light 431 at the wire bridges 410a and 410b, to remove any insulating material (coating, such as enamel) therefrom, to enhance subsequent bonding to terminals of the chip, as discussed hereinabove.

FIG. 4B illustrates a technique for shaping (flattening) the wire, in preparation for bonding. A substrate 454 (compare 204) has a recess 456 (compare 206) extending through upper layers 454a (compare 104a) thereof, and slots 457a and 457b (compare 220a and 220b) extending from opposite side edges of the recess 456 completely through the substrate 454, including bottom layers 454b (compare 104b) thereof. End portions 460a and 460b (compare 210a and 210b) of an antenna wire 460 (compare 210) extend as "wire bridges" across the slots 457a and 457b.

Before installing a chip 458 (compare 208) in the recess 456, a punch 470 is brought down on the wire bridges 460a and 460b to flatten out the wire from its initial circular cross-section to a flatter cross-section. To facilitate this shaping, the substrate may be disposed on a surface 472 functioning as an anvil, having raised portions 674a and 674b which fit up into the slots 457a and 457b so that the wire does not break when shaping it.

This shaping (flattening) step can be done before or after the step of removing insulation from the wire bridges. In this figure, the wire bridge 460a is shown as having already been flattened, and the wire bridge 460b is in the process of being flattened.

Generally speaking, the tools used to perform the methods described herein are not new, rather they are well known and readily available. Some tools have been described hereinabove. Die bonders (such as Kulike and Soffa, Willow Grove, Pa.) use many of the same tools and techniques, such as suction pipette, heated work plate, and the like.

A tool (330) for repositioning wire bridges spanning a recess is shown and described, hereinabove, with respect to FIGS. 3A-3D.

Description of a Manufacturing Flow

Various methods have been described hereinabove relating to mounting an antenna wire on a substrate with end portions of the wire (wire bridges) spanning a recess and spaced sufficiently apart from one another that a transponder chip may be disposed in the recess after the antenna wire is mounted. This allows for inserting the transponder chip into the recess after the antenna wire is mounted, as well as for removing insulation from the wire bridges using a laser, before the transponder chip is mounted in the recess. After insulation is removed from the wire bridges, and the transponder chip is installed in the recess, the wire bridges may be interconnected (bonded) to the terminals of the transponder chip (or chip module).

FIG. 5 illustrates a manufacturing flow 500, showing a possible organization for the various manufacturing steps set forth hereinabove.

In a first step 502, a substrate is prepared. The substrate may have one or more (an array of) inlay sites. The substrate may be a multi-layer substrate, as discussed above. A given inlay site may have a recess (cavity, window) and may have slots, as described above. Substrates may be prepared well ahead of time, "off-line".

In a next step 504, an antenna wire is mounted to (embedded in, adhesively placed on) the substrate, as discussed above, with end portions of the wire spanning a recess (or cavity, or window), forming "wire bridges", as discussed hereinabove.

In a next step 506, the wire may be flattened (shaped), as discussed above (FIG. 4B). This step is optional.

In a next step 508, which can be skipped if the wire is not insulated, the insulation is removed from the wire bridges spanning the recess, as discussed hereinabove (FIG. 4A). It is within the scope of the invention that the insulation may be removed from portions of the wire corresponding to the wire bridges prior to mounting the antenna wire to the substrate and forming the bridges.

In a next step 510, the transponder chip (or module) is installed on the inlay substrate, into the recess, past the wire bridges which are spaced sufficiently apart to allow the chip to be installed past the wire bridges. Alternatively, the chip may be installed from the opposite side of the substrate into a recess (window) extending completely through the substrate.

It should be understood that the substrate may be set up for a plurality of inlays, receiving a plurality of transponder chips, such as a 3×6 array of inlays.

Next, using one of the techniques described hereinabove, the relative position between the terminals of the chip and the wire bridges is modified so that the wire bridges are positioned over corresponding terminals of the chip, for bonding thereto. This is shown by steps 512a and 512b.

In the step 512a, the chip is rotated within the recess to position its terminals under the corresponding wire bridges, and the wires are bonded to the terminals, such as described hereinabove with respect to FIGS. 2A-2D.

In the step 512b, the wire bridges are re-positioned to be over the terminals of the chip, and the wires are bonded to the terminals, such as described hereinabove with respect to FIGS. 3A-3D.

Next, in a step 516, various post-processing steps may be performed, such as assembling the transponder inlay with additional layers of sheets in preparation for lamination In a step 518, if there are a plurality of inlays on a common substrate, they may be singulated (separated) from the substrate.

In a step 520, various post-processing steps applicable to individual secure inlays may be performed.

Generally, each of the steps discussed hereinabove may be performed at a different station, or stations, in a manufacturing environment. This has various advantages, such as improved yields from the manufacturing process and greater throughput from the embedding machine with fewer operators.

One of ordinary skill in the art will readily understand how this, or other steps recited in this "fab flow" may be rearranged, recombined and/or omitted to suit particular circumstances, based on the teachings set forth herein.

A Passport Inlay (FIG. 6)

FIG. 6A illustrates the design of the current inlay 600 for passports. Generally, a contactless (RFID) chip module 608 is disposed in a recess in a substrate 604 comprising a Teslin™ sheet.

> Teslin™ is a synthetic printing media, manufactured by PPG Industries. Teslin is a waterproof synthetic material that works well with an Inkjet printer, Laser printer, or Thermal printer. Teslin™ is also single-layer, uncoated film, and extremely strong. In fact, the strength of the lamination peel of a Teslin™ sheet is 2-4 times stronger than other coated synthetic and coated papers. Teslin comes in the sizes of 7 mil to 18 mil, though only sizes 10 mil and 14 mil are sized at 8.5" by 11", for printing with most consumer printers. Also available are perforated versions of Teslin, specifically, 2up, 6up, and 8up.

The substrate 604 can be considered to be a multi-layer substrate with the Teslin™ sheet forming a top layer 604a and the passport cover page forming a bottom layer 604b. Generally, this view is upside down in contrast with the previous view of FIG. 1B. In this example of a passport, a cover page 604b for the passport, which may be paper, is laminated using a hotmelt adhesive 605 to the front surface of the Teslin™ sheet 604a, in a cold lamination process. The adhesive 605 may have a thickness of approximately 20 µm.

The chip module 608 is disposed in a recess 606 in the approximately Teslin™ sheet 604a, which may be formed using an ultrasonic stamp process in the front (bottom, as viewed) surface of the sheet.

The Teslin™ sheet 604a may have a thickness of approximately 355 µm. The passport cover page 604b may have a thickness of approximately 350 µm.

The Teslin™ sheet 604a extends from an outer edge of the overall passport booklet, to the binding, which is the common edge of two adjacent pages. A hinge gap 609 is shown, to the left of which is the Teslin™ sheet 604a, and to the right of which may be a conventional passport page 611 (or more Teslin™). Notice that the recess 606 extends all the way through the Teslin sheet 604a, and the back (top, as viewed) of the mold mass of the chip module 608 is exposed.

An antenna wire 610, comprising self-bonding coated wire, which may have a diameters of 112 µm is pressed (embedded) partially into the front surface of the Teslin™ sheet 604a. The chip module 608 has two terminals (not explicitly shown) to which the two end portions (wire bridges) 610a and 610b are bonded, as described hereinabove.

There are a number of problems associated with the passport construction described hereinabove. For example, the chip module is exposed and moisture can enter between the mould mass and the Teslin sheet. The mould mass protecting the chip is itself not protected from the environment. A sudden shock to the top of the chip module may render it non-functional. Also, the wire being used is self-bonding coated wire which is not embedded into the Teslin substrate, but rather adhesively attached to the substrate. Then, in a further process step, the antenna is pre-pressed into the substrate using a hot lamination process. The area in the Teslin substrate around the position of the chip module is formed using an ultrasonic stamp. It is not known for certain how the material will react in the field, perhaps causing bulges in the cover material (air pockets forming) or in the Teslin material or both.

According to an embodiment of the invention, generally, some of the aforementioned problems may be solved by introducing a two level recess layer in the Teslin material. The recess may be are milled out of the material. The recess can be round, such as in FIGS. 2A-2D and FIGS. 3A-3D, or can be conventional rectangular (including square). The chip module is protected by a silicon cushion and is not exposed to the environment.

FIG. 6B illustrates the design of an inlay 650 for passports. Generally, a contactless (RFID) chip module 658 (compare 608) is disposed in a recess 656 (compare 606) in a substrate 654 (compare 604) comprising a Teslin™ sheet.

The substrate 654 can be considered to be a multi-layer substrate with the Teslin™ sheet forming a top layer 654a (compare 604a) and the passport cover page forming a bottom layer 654b (compare 604b). Generally, this view is upside down in contrast with the previous view of FIG. 1B. In this example of a passport, a cover page 654b for the passport, which may be paper, is laminated using a hotmelt adhesive 605 to the front surface of the Teslin™ sheet 604a, using a cold or hot lamination process. The adhesive 605 may have a thickness of approximately 20 µm. Alternatively, a cold laminating process can be used. A double-sided tape could be used. The two sheets 654a and 654b are analogous to the upper and lower layers 204a and 204b (or 304a and 304b) of a multilayer substrate 204 (or 304).

The chip module 658 is disposed in the recess 656 in the approximately Teslin™ sheet 654a, which may be formed using a high speed milling tool (not shown) to create a stepped (larger area, followed by a smaller area) recess in the front (bottom, as viewed) surface of the sheet.

The recess 656 does not go all the way through the layer 604a, but rather stops, leaving at least approximately 35 μm of material behind the chip module 658. This ensures that moisture will not enter.

The recess 656 is sized and shape to accommodate a thin layer 657 of synthetic cushion material (such as silicone rubber) between the chip module 658 and the substrate layer 654a. This provides some protection against shock, as well as against moisture.

The Teslin™ sheet 654a may have a thickness of approximately 355 μm. The passport cover page 654b may have a thickness of approximately 350 μm.

The Teslin™ sheet 654a extends from an outer edge of the overall passport booklet, to the binding, which is the common edge of two adjacent pages. A hinge gap 659 is shown, to the left of which is the Teslin™ sheet 654a, and to the right of which is a conventional passport page 661 (or more Teslin™). Notice that the recess 656 does not extend all the way through the Teslin sheet 654a, and therefore the back (top, as viewed) of the mold mass of the chip module 658 is not exposed.

An antenna wire 660, comprising insulated wire, which may have a diameters of 70 μm is embedded directly into the front surface of the Teslin™ sheet 654a. The chip module 658 has two terminals (not explicitly shown) to which the two end portions (wire bridges) 660a and 660b are bonded, as described hereinabove. It can be noted that the antenna wire 660 is substantially fully embedded (in contrast with the antenna wire 610 which is only partially embedded. This can be achieved by using a higher frequency in the embedding tool, such as 60 Hz, rather than 30 Hz.

While the invention has been described with respect to a limited number of embodiments, these should not be construed as limitations on the scope of the invention, but rather as examples of some of the embodiments. Those skilled in the art may envision other possible variations, modifications, and implementations that are also within the scope of the invention, based on the disclosure(s) set forth herein.

What is claimed is:

1. Method of connecting an antenna wire to a transponder chip comprising:
   providing a recess in a surface of a substrate;
   mounting the antenna wire to the surface of the substrate so that two end portions of the antenna wire span the recess;
   characterized by:
   after mounting the antenna wire to the surface of the substrate, installing the transponder chip in the recess, past the end portions of the antenna wire; and
   after installing the transponder chip in the recess, bonding the end portions of the antenna wire to corresponding terminals of the transponder chip.

2. The method of claim 1, wherein the antenna wire is an insulated wire conductor, further comprising:
   prior to installing the transponder chip in the recess, removing insulation from the end portions of the antenna wire.

3. The method of claim 1, further comprising:
   after installing the transponder chip in the recess and prior to bonding, rotating the transponder chip in the recess to bring the terminals into alignment with the end portions of the antenna wire.

4. The method of claim, further comprising:
   after installing the transponder chip in the recess and prior to bonding, repositioning the end portions of the antenna wire to be in alignment with the terminals of the transponder chip.

5. The method of claim 1, wherein:
   the two end portions of the antenna wire are spaced a distance apart which is greater than at least one of the cross dimensions of the transponder chip; and
   the distance is substantially equal to a spacing between the terminals of the transponder chip.

6. The method of claim 1, wherein:
   the two end portions of the antenna wire are initially spaced a distance apart which is greater than at least one of the cross dimensions of the transponder chip;
   after installing the transponder chip in the recess and prior to bonding, the end portions of the antenna wire are repositioned so that the distance between the two end portions of the antenna wire is substantially equal to a spacing between the terminals of the transponder chip.

7. The method of claim 1, further comprising:
   prior to bonding the end portions of the antenna wire to the terminals, flattening the end portions of the antenna wire.

8. The method of claim 1, further comprising:
   after installing the transponder chip in the recess and prior to bonding, rotating the transponder chip within the recess to bring terminals of the transponder chip into alignment with, substantially directly below corresponding ones of the end poritons of the antenna wire, for bonding thereto.

9. The method of claim 8, wherein the transponder chip is rotated 90 degress within the recess.

10. The method of claim 8, wherein the antenna wire is an insulated wire conductor, further comprising;
    prior to installing the transponder chip in the recess, removing insulation from the end portions of the antenna wire.

11. Method of connecting an antenna wire to a transponder chip comprising:
    providing a recess in a surface of a substrate;
    mounting the antenna wire to the surface of the substrate so that two end portions of the antenna wire span the recess;
    characterized by:
    after mounting the antenna wire to the surface of the substrate, installing the transponder chip in the recess, past the end portions of the antenna wire; and
    after installing the transponder chip in the recess, bonding the end portions of the antenna wire to corresponding terminals of the transponder chip; and
    prior to bonding the end portions of the antenna wire to corresponding terminals of the transponder chip, flattening the end portions of the antenna wire.

12. Method of connecting an antenna wire to a transponder chip comprising:
    providing a recess in a surface of a substrate;
    mounting the antenna wire to the surface of the substrate so that two end portions of the antenna wire span the recess;
    installing the transponder chip in the recess, between the two end portions of the antenna wire; and
    after installing the transponder chip in the recess and prior to bonding, repositioning the end portions of the antenna wire to be substantially directly over respective terminals of the transponder chip for bonding thereto.

13. The method of claim 12, further comprising:
    bonding the end portions of the antenna wire to the terminals.

14. The method of claim 13, further comprising;
prior to bonding the end portions of the antenna wire to the terminals, flattening the end portions of the antenna wire.

15. The method of claim 12, wherein the antenna wire is an insulated wire conductor, further comprising:
prior to installing the transponder chip in the recess, removing insulation from the end portions of the antenna wire.

16. Method of connecting an antenna wire to a transponder chip comprising:
providing a recess in a surface of a substrate;
mounting the antenna wire to the surface of the substrate so that two end portions of the antenna wire span the recess;
installing the transponder chip into the recess from the same side of the substrate as the antenna, past the end portions of the wires, after the antenna has been mounted to the substrate;
after installing the transponder chip into the recess and prior to bonding, aligning the terminals with the end portions of the antenna wire for bonding thereto.

17. The method of claim 16, further comprising:
bonding the end portions of the antenna wire to the terminals.

18. The method of claim 17, further comprising:
prior to bonding the end portions of the antenna wire to the terminals, flattening the end portions of the antenna wire.

19. The method of claim 16, wherein the antenna wire is an insulated wire conductor, further comprising:
prior to installing the transponder chip in the recess, removing insulation from the end portions of the antenna wire.

* * * * *